US012777861B2

(12) United States Patent
Ventzek et al.

(10) Patent No.: US 12,777,861 B2
(45) Date of Patent: Oct. 27, 2026

(54) METHODS OF PLASMA PROCESSING USING A PULSED ELECTRON BEAM

(71) Applicant: Tokyo Electron Limited, Tokyo (JP)

(72) Inventors: Peter Ventzek, Austin, TX (US); Alok Ranjan, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 1691 days.

(21) Appl. No.: 16/737,716

(22) Filed: Jan. 8, 2020

(65) Prior Publication Data

US 2021/0210355 A1 Jul. 8, 2021

(51) Int. Cl.
*H10P 50/28* (2026.01)
*C23C 16/455* (2006.01)
(Continued)

(52) U.S. Cl.
CPC ...... *H10P 50/287* (2026.01); *C23C 16/45536* (2013.01); *H01J 37/3211* (2013.01); *H01J 37/32449* (2013.01); *H01J 37/32715* (2013.01); *H10P 14/6336* (2026.01); *H10P 14/6339* (2026.01); *H10P 14/683* (2026.01);
(Continued)

(58) Field of Classification Search
CPC .......... H01J 37/32449; H01J 37/32027; H01L 21/0228; H01L 21/02274; H01L 21/3065; H01L 21/30655; H10P 14/6336; H10P 14/6339; H10P 72/0421; H10P 72/0418;
(Continued)

(56) References Cited

U.S. PATENT DOCUMENTS 4,533,448 A * 8/1985 Scala ........................ C08J 3/091
524/901
5,510,164 A * 4/1996 Best .......................... G11B 7/24
(Continued)

FOREIGN PATENT DOCUMENTS

CN 101111922 A 1/2008
CN 101821836 A 9/2010
(Continued)

OTHER PUBLICATIONS

Ratner et al. ("Plasma Deposition and Treatment for Biomaterial Applications.") (Year: 1990).*
(Continued)

*Primary Examiner* — Sophia T Nguyen
(74) *Attorney, Agent, or Firm* — Slater Matsil, LLP

(57) ABSTRACT

A method of plasma processing includes continuously providing a gas into a processing chamber and AC source power to a source power coupling element for a first duration. The AC source power generates a plasma in the processing chamber. The method further includes, while providing the gas and the AC source power, applying a first negative bias voltage to an electron source electrode for a second duration and removing the first negative bias voltage from the electron source electrode for a third duration to discontinue the generation of the electron beam at the end of the second duration. The first negative bias voltage generates an electron beam directed towards a substrate holder. The method also includes applying a second negative bias voltage to the substrate holder while providing the gas and the AC power. The first duration is equal to the sum of the second duration and the third duration.

19 Claims, 8 Drawing Sheets

(51) Int. Cl.
*H01J 37/32* (2006.01)
*H10P 14/60* (2026.01)
*H10P 14/68* (2026.01)
*H10P 72/00* (2026.01)
*H10P 72/72* (2026.01)
*H10W 20/00* (2026.01)

(52) U.S. Cl.
CPC ........ *H10P 72/0421* (2026.01); *H10P 72/722* (2026.01); *H10W 20/069* (2026.01); *H01J 2237/3321* (2013.01); *H01J 2237/3341* (2013.01)

(58) Field of Classification Search
CPC ...... H10P 50/244; H10P 50/28; H10P 50/283; H10P 76/4085
See application file for complete search history.

(56) References Cited

U.S. PATENT DOCUMENTS 5,767,018 A * 6/1998 Bell .................. H01L 21/32139 438/743
5,928,528 A * 7/1999 Kubota ............. H01J 37/32706 257/E21.252
6,503,410 B1 * 1/2003 Blalock ................. H01J 37/321 216/68
6,673,724 B2 * 1/2004 Forster ................ H01J 37/3405 438/758
6,755,945 B2 * 6/2004 Yasar ................ H01L 21/76843 257/E21.585
6,806,201 B2 * 10/2004 Sumiya ................. C23C 16/507 438/714
6,863,018 B2 * 3/2005 Koizumi ........... H01J 37/32422 156/345.43
7,514,375 B1 * 4/2009 Shanker ............ H01L 21/02164 438/789
7,642,193 B2 * 1/2010 Ventzek .............. H01L 21/0337 257/E21.311
7,829,469 B2 * 11/2010 Chen ................. H01J 37/32091 156/345.44
7,901,545 B2 * 3/2011 Cerio, Jr. .......... H01L 21/76873 438/653
7,951,683 B1 * 5/2011 Shanker ............ H01L 21/31116 257/E21.546
8,263,499 B2 * 9/2012 Honda ................ H01L 21/0273 438/725
8,735,291 B2 * 5/2014 Ranjan ................ H01J 37/3244 438/257
9,269,587 B2 * 2/2016 Shimizu ............ H01J 37/32091
9,378,970 B2 * 6/2016 Joubert ............. H01L 21/31116
9,384,998 B2 * 7/2016 Hudson ............. H01J 37/32577
9,595,451 B1 * 3/2017 Zhou ................. H01L 21/31116
9,633,864 B2 * 4/2017 Watanabe ......... H01L 21/76897
9,881,807 B2 * 1/2018 Ranjan .............. H01J 37/32963
10,312,055 B2 * 6/2019 Suzuki .............. H01L 21/02219
10,544,505 B2 1/2020 Yang et al.
10,790,157 B1 * 9/2020 Oehrlein ............. H01L 21/0212
10,818,502 B2 * 10/2020 Voronin ............ H01J 37/32706
10,964,511 B2 * 3/2021 Shim ................. H01L 21/30655
10,998,169 B2 * 5/2021 Ventzek .............. H01L 21/6831
11,158,516 B2 * 10/2021 Ranjan .................. H01J 37/321
2001/0051438 A1 * 12/2001 Shin .................. H01L 21/31116 257/E21.252
2002/0019141 A1 * 2/2002 Ito ..................... H01J 37/32431 438/729
2002/0104481 A1 * 8/2002 Chiang ............. C23C 16/45538 257/E21.582
2002/0115301 A1 * 8/2002 Savas .................... H01J 37/321 156/345.48
2002/0139658 A1 * 10/2002 Kanakasabapathy ........................ H01J 37/32422 204/164
2002/0164423 A1 * 11/2002 Chiang ................. C23C 16/481 427/255.28
2002/0182880 A1 * 12/2002 Zhu ................... H01L 21/76811 257/E21.252
2002/0189544 A1 * 12/2002 Hedberg ........... H01L 21/31116 257/E21.252
2003/0104141 A1 * 6/2003 Amato-Wierda ........................... H01J 37/32348 427/580
2003/0139005 A1 * 7/2003 Song ................. H01L 21/02205 257/E21.28
2003/0164142 A1 * 9/2003 Koshimizu ....... H01J 37/32642 118/409
2004/0033697 A1 * 2/2004 Kumar ................ H01L 21/3065 257/E21.218
2004/0124177 A1 * 7/2004 Urban ............... H01J 37/32082 216/67
2004/0157457 A1 * 8/2004 Xu ...................... H01L 21/0212 257/E21.235
2004/0157466 A1 * 8/2004 Xu ...................... H01L 29/6656 438/758
2004/0163762 A1 * 8/2004 Iizuka ............... H01J 37/32706 156/345.39
2005/0106875 A1 * 5/2005 Kubota ............. H01L 21/31116 257/E21.252
2005/0136682 A1 * 6/2005 Hudson ............. H01L 21/31116 438/714
2006/0005930 A1 * 1/2006 Ikeda .................. H01L 21/6831 156/345.51
2006/0037701 A1 * 2/2006 Koshiishi .......... H01L 21/02126 257/E21.252
2006/0121704 A1 6/2006 Walther et al.
2007/0026677 A1 * 2/2007 Ji ........................ H01L 21/0337 438/689
2007/0165355 A1 * 7/2007 Sato .................. H01L 21/31138 257/E21.252
2007/0193975 A1 * 8/2007 Wilson ................ H01L 21/3065 216/70
2008/0083502 A1 * 4/2008 Heo .................... H01L 21/0337 257/E21.264
2008/0105378 A1 * 5/2008 Sugimoto ......... H01L 21/31138 257/E21.252
2008/0135518 A1 * 6/2008 Chen ................. H01J 37/32091 118/723 E
2008/0251920 A1 * 10/2008 Ishikawa ........... H01L 21/02274 257/E23.141
2008/0286978 A1 * 11/2008 Chen ................. H01L 21/30655 438/713
2008/0317965 A1 * 12/2008 Son ................... H01J 37/32009 156/345.43
2009/0029557 A1 * 1/2009 Kikuchi ............ H01J 37/32091 156/345.34
2009/0075472 A1 * 3/2009 Arnold .............. H01L 21/02203 438/623
2009/0084987 A1 4/2009 Godet et al.
2009/0163035 A1 * 6/2009 Romano ........... H01L 21/32139 438/736
2009/0197420 A1 * 8/2009 Luong ............... H01J 37/32697 438/713
2009/0221148 A1 * 9/2009 Uda .................... H01L 21/3086 438/719
2009/0275202 A1 * 11/2009 Tanaka .............. H01L 21/02164 700/121
2009/0275207 A1 * 11/2009 Honda .............. H01L 21/31116 438/729
2010/0003827 A1 * 1/2010 Kessels ............. H01J 37/32055 438/719
2010/0009542 A1 * 1/2010 Honda ................ H01L 21/0212 257/E21.241
2010/0105209 A1 * 4/2010 Winniczek ........ H01L 21/32137 438/719
2010/0130018 A1 * 5/2010 Tokashiki ......... H01J 37/32082 156/345.48
2010/0210114 A1 * 8/2010 Ooya ................ H01J 37/32027 438/729

(56) References Cited

U.S. PATENT DOCUMENTS

| | | | | | |
|---|---|---|---|---|---|
| 2010/0213172 | A1* | 8/2010 | Wilson | H01L 21/6833 | 156/345.1 |
| 2010/0243605 | A1* | 9/2010 | Nishizuka | H01J 37/32165 | 156/345.28 |
| 2010/0273332 | A1* | 10/2010 | Edelberg | H01J 37/32146 | 156/345.24 |
| 2011/0031216 | A1* | 2/2011 | Liao | H01J 37/32146 | 216/67 |
| 2011/0048453 | A1* | 3/2011 | Honda | C23C 16/4405 | 134/1.1 |
| 2011/0070665 | A1* | 3/2011 | Chen | H01J 37/32165 | 257/E21.528 |
| 2011/0139748 | A1* | 6/2011 | Donnelly | H01J 37/32045 | 216/37 |
| 2011/0318933 | A1* | 12/2011 | Yatsuda | H01L 21/3065 | 438/712 |
| 2012/0024229 | A1* | 2/2012 | Liu | H01J 37/3461 | 118/723 MA |
| 2012/0129278 | A1* | 5/2012 | Yoshii | B81C 1/00087 | 257/E21.529 |
| 2012/0235034 | A1* | 9/2012 | Shiokawa | G01L 21/32 | 250/287 |
| 2013/0105303 | A1* | 5/2013 | Lubomirsky | H01J 37/32091 | 204/192.34 |
| 2013/0168354 | A1* | 7/2013 | Kanarik | H01J 37/32082 | 216/68 |
| 2013/0236989 | A1* | 9/2013 | Ranjan | H01L 21/02271 | 438/5 |
| 2013/0237060 | A1* | 9/2013 | Ranjan | H01L 21/02126 | 438/700 |
| 2013/0260561 | A1* | 10/2013 | Ranjan | H01L 21/31144 | 438/696 |
| 2014/0263182 | A1* | 9/2014 | Chen | H01J 37/32091 | 156/345.1 |
| 2014/0264782 | A1* | 9/2014 | Yang | H01L 21/76816 | 438/668 |
| 2014/0273487 | A1* | 9/2014 | Deshmukh | H01L 21/6875 | 156/345.43 |
| 2015/0011088 | A1* | 1/2015 | McNie | H01J 37/32449 | 216/60 |
| 2015/0011093 | A1* | 1/2015 | Singh | H01L 21/67213 | 438/712 |
| 2015/0072530 | A1* | 3/2015 | Kim | H01J 37/32091 | 438/703 |
| 2015/0075566 | A1* | 3/2015 | Tanikawa | C23C 16/4401 | 29/559 |
| 2015/0083580 | A1* | 3/2015 | Shimizu | H01L 21/32137 | 204/192.3 |
| 2015/0093907 | A1* | 4/2015 | Yieh | H01L 21/0228 | 438/758 |
| 2015/0155189 | A1* | 6/2015 | Cho | H01J 37/32541 | 438/731 |
| 2015/0160557 | A1* | 6/2015 | deVilliers | G03F 7/2024 | 430/323 |
| 2015/0162168 | A1* | 6/2015 | Oehrlein | H01J 37/32146 | 216/37 |
| 2015/0200109 | A1* | 7/2015 | Kong | H01L 21/32139 | 118/723 R |
| 2015/0228495 | A1* | 8/2015 | Joubert | H01L 21/31116 | 156/345.1 |
| 2015/0348773 | A1 | 12/2015 | Zhu et al. | | |
| 2015/0364339 | A1* | 12/2015 | Guha | H01L 21/67069 | 438/712 |
| 2016/0005594 | A1* | 1/2016 | Omstead | H01L 21/0228 | 118/723 MP |
| 2016/0005839 | A1* | 1/2016 | Yieh | H01J 37/32623 | 438/506 |
| 2016/0013067 | A1* | 1/2016 | Wang | H01L 21/32136 | 438/702 |
| 2016/0163556 | A1* | 6/2016 | Briggs | H01J 37/32577 | 156/345.24 |
| 2016/0211149 | A1 | 7/2016 | Watanabe et al. | | |
| 2016/0293432 | A1* | 10/2016 | Ranjan | H01L 21/3065 | |
| 2016/0372327 | A1* | 12/2016 | Ventzek | H01L 21/02057 | |
| 2017/0040174 | A1* | 2/2017 | Long | H01J 37/32146 | |
| 2017/0062209 | A1* | 3/2017 | Shiba | H01L 21/76832 | |
| 2017/0098527 | A1* | 4/2017 | Kawasaki | H01J 37/32082 | |
| 2017/0099722 | A1* | 4/2017 | Kawasaki | H01J 37/32174 | |
| 2017/0103873 | A1* | 4/2017 | Kawasaki | H01J 37/32183 | |
| 2017/0107621 | A1* | 4/2017 | Suemori | C23C 16/52 | |
| 2017/0117159 | A1* | 4/2017 | Kanarik | C23C 16/45544 | |
| 2017/0162417 | A1* | 6/2017 | Ye | H01L 21/6833 | |
| 2017/0186586 | A1* | 6/2017 | Oh | H01J 37/32963 | |
| 2017/0278709 | A1* | 9/2017 | Mebarki | H01L 21/02266 | |
| 2017/0278743 | A1* | 9/2017 | Tsai | H01L 29/7851 | |
| 2017/0358428 | A1* | 12/2017 | Kawasaki | H01J 37/3244 | |
| 2018/0033644 | A1* | 2/2018 | Takahashi | C23C 16/345 | |
| 2018/0047578 | A1* | 2/2018 | Morikita | H01L 21/31144 | |
| 2018/0061628 | A1* | 3/2018 | Ou | H01L 21/32 | |
| 2018/0061655 | A1* | 3/2018 | Tabata | H01L 21/02211 | |
| 2018/0061700 | A1* | 3/2018 | Sun | H01L 21/31116 | |
| 2018/0144946 | A1* | 5/2018 | Voronin | H01J 37/32082 | |
| 2018/0182634 | A1* | 6/2018 | Smith | H01J 37/32899 | |
| 2018/0261430 | A1* | 9/2018 | Kawasaki | H01J 37/32128 | |
| 2018/0286663 | A1* | 10/2018 | Kobayashi | H01L 21/0228 | |
| 2018/0301346 | A1* | 10/2018 | Kumakura | H01L 21/02164 | |
| 2018/0301347 | A1* | 10/2018 | Kihara | H01L 21/0228 | |
| 2018/0323045 | A1* | 11/2018 | Marion | H01J 37/32477 | |
| 2018/0323074 | A1* | 11/2018 | Harrison | H01L 21/3081 | |
| 2019/0035605 | A1* | 1/2019 | Suzuki | H01L 21/02274 | |
| 2019/0131141 | A1 | 5/2019 | Kihara et al. | | |
| 2019/0146336 | A1* | 5/2019 | Chen | H01L 21/02288 | 216/13 |
| 2019/0148155 | A1 | 5/2019 | Kubota et al. | | |
| 2019/0259626 | A1* | 8/2019 | Tabata | H01J 37/32715 | |
| 2019/0348296 | A1* | 11/2019 | Sherpa | H01J 37/32009 | |
| 2020/0006036 | A1* | 1/2020 | Guo | H01J 37/321 | |
| 2020/0027717 | A1* | 1/2020 | Park | H01L 21/02274 | |
| 2020/0043795 | A1* | 2/2020 | Chang | H01L 27/0886 | |
| 2020/0058469 | A1* | 2/2020 | Ranjan | H01L 21/67069 | |
| 2020/0058470 | A1* | 2/2020 | Ventzek | H01J 37/32146 | |
| 2020/0058503 | A1* | 2/2020 | Vidyarthi | H01L 21/02118 | |
| 2020/0075346 | A1* | 3/2020 | Ventzek | H01J 37/32155 | |
| 2020/0135458 | A1* | 4/2020 | Mehrotra | H01L 21/0228 | |
| 2020/0303181 | A1* | 9/2020 | Kihara | H01L 21/02219 | |
| 2021/0050183 | A1* | 2/2021 | Ventzek | H01J 37/32146 | |
| 2021/0082667 | A1* | 3/2021 | Zhao | H01L 21/31116 | |
| 2021/0134587 | A1* | 5/2021 | Chen | C23C 16/45538 | |
| 2021/0143016 | A1* | 5/2021 | Yokoyama | H01L 21/31116 | |
| 2021/0210355 | A1* | 7/2021 | Ventzek | C23C 16/45536 | |
| 2021/0296132 | A1* | 9/2021 | Ventzek | H01L 21/30621 | |
| 2021/0343502 | A1* | 11/2021 | Sun | H01L 21/31138 | |
| 2022/0028693 | A1* | 1/2022 | Bhosle | H01L 21/31116 | |
| 2022/0028695 | A1* | 1/2022 | Ranjan | H01J 37/32082 | |
| 2022/0059358 | A1* | 2/2022 | Ventzek | H01L 21/3065 | |
| 2022/0139719 | A1* | 5/2022 | Chino | H01L 21/31116 | 438/719 |
| 2022/0157610 | A1* | 5/2022 | Yokoyama | H01L 21/32137 | |
| 2022/0293884 | A1* | 9/2022 | Li | H10K 50/844 | |

FOREIGN PATENT DOCUMENTS

| | | | |
|---|---|---|---|
| CN | 104733278 | A | 6/2015 |
| CN | 110419091 | A | 11/2019 |
| KR | 20110139660 | A | 12/2011 |
| KR | 20120024544 | A | 3/2012 |
| KR | 20170075887 | A | 7/2017 |
| TW | 201324610 | A | 6/2013 |
| TW | 201340206 | A | 10/2013 |

OTHER PUBLICATIONS

Roozeboom et al. ("Cyclic Etch/Passivation-Deposition . . . ") (Year: 2015).*

International Search Report and Written Opinion of the International Searching Authority, PCT Application No. PCT/US2020/056583, Feb. 10, 2021, 10 pages.

Metzler, Dominik et al., "Fluorocarbon assisted atomic layer etching of SiO2 using cyclic Ar/C4F8 plasma," Journal of Vacuum

(56) References Cited

OTHER PUBLICATIONS

Science & Technology, A: Vacuum, Surfaces, and Films 32, 020603 (2014), 5 pages.
China National Intellectual Property Administration, "Notification of the First Office Action," Application No. 202080092308.7, Mar. 12, 2025, 11 pages.
Translated Korean Office Action, Patent Application No. 10-2022-7026327, Dec. 3, 2024, 14 pages.

* cited by examiner

METHODS OF PLASMA PROCESSING USING A PULSED ELECTRON BEAM

TECHNICAL FIELD

The present invention relates generally to methods of plasma processing, and, in particular embodiments, to systems, apparatuses and methods for plasma processing using a pulsed electron beam.

BACKGROUND

Device formation on and within microelectronic workpieces may involve a series of manufacturing techniques including formation, patterning, and removal of a number of layers of material on a substrate. In order to achieve the physical and electrical specifications of current and next generation semiconductor devices, processing equipment and methods that enable reduction of feature size while maintaining structural integrity are desirable for various patterning processes. As device structures densify and develop vertically, the desire for precision material processing becomes more compelling.

Atomic-level precision in plasma processes is useful for profile control in a variety of plasma processes. However, conventional plasma processes may be incapable of depositing and/or etching films with monolayer finesse due to gas switching speed limitations. Therefore, methods of plasma processing that include a means of controlling deposition/etching processes at timescales faster than the gas switching speed (e.g. at timescales associated with the growth of a single monolayer of a film) may be desirable.

SUMMARY

In accordance with an embodiment of the invention, a method of plasma processing includes continuously providing a gas into a processing chamber for a first duration and continuously providing alternating current (AC) source power to a source power coupling element for the first duration while providing the gas. The AC source power generates a plasma in the processing chamber. The method further includes, while providing the gas and the AC source power, applying a first negative bias voltage to an electron source electrode for a second duration and removing the first negative bias voltage from the electron source electrode for a third duration to discontinue the generation of the electron beam at the end of the second duration. The first negative bias voltage generates an electron beam directed towards a substrate holder. The method also includes applying a second negative bias voltage to the substrate holder while providing the gas and the AC power. The first duration is equal to the sum of the second duration and the third duration. The method may be performed cyclically.

In accordance with another embodiment of the invention, a method of plasma etching includes generating an inductively coupled plasma in a processing chamber and forming a first polymer layer at a first surface of a substrate disposed in the processing chamber using a first electron beam directed toward the first surface. The first electron beam is generated for a first duration by a first negative bias voltage at a second surface of an electron source electrode facing the first surface. The method further includes etching the first polymer layer and the first surface of the substrate after the first duration by accelerating positive ions of the inductively coupled plasma towards the first surface using a second negative bias voltage applied for a second duration.

In accordance with still another embodiment of the invention, a plasma processing apparatus includes a processing chamber, a first direct current (DC) power supply node, an electron source electrode coupled to the first DC power supply node and including a first surface, a substrate holder disposed in the processing chamber, and a radio frequency (RF) source power coupling element disposed outside the processing chamber configured to inductively couple RF source power to a plasma generated within the processing chamber. The electron source electrode is configured to generate a pulsed electron beam in the processing chamber using a first pulsed DC bias potential supplied to the electron source electrode by the first DC power supply node. The first surface is inside the processing chamber. The substrate holder includes a second surface facing the first surface.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
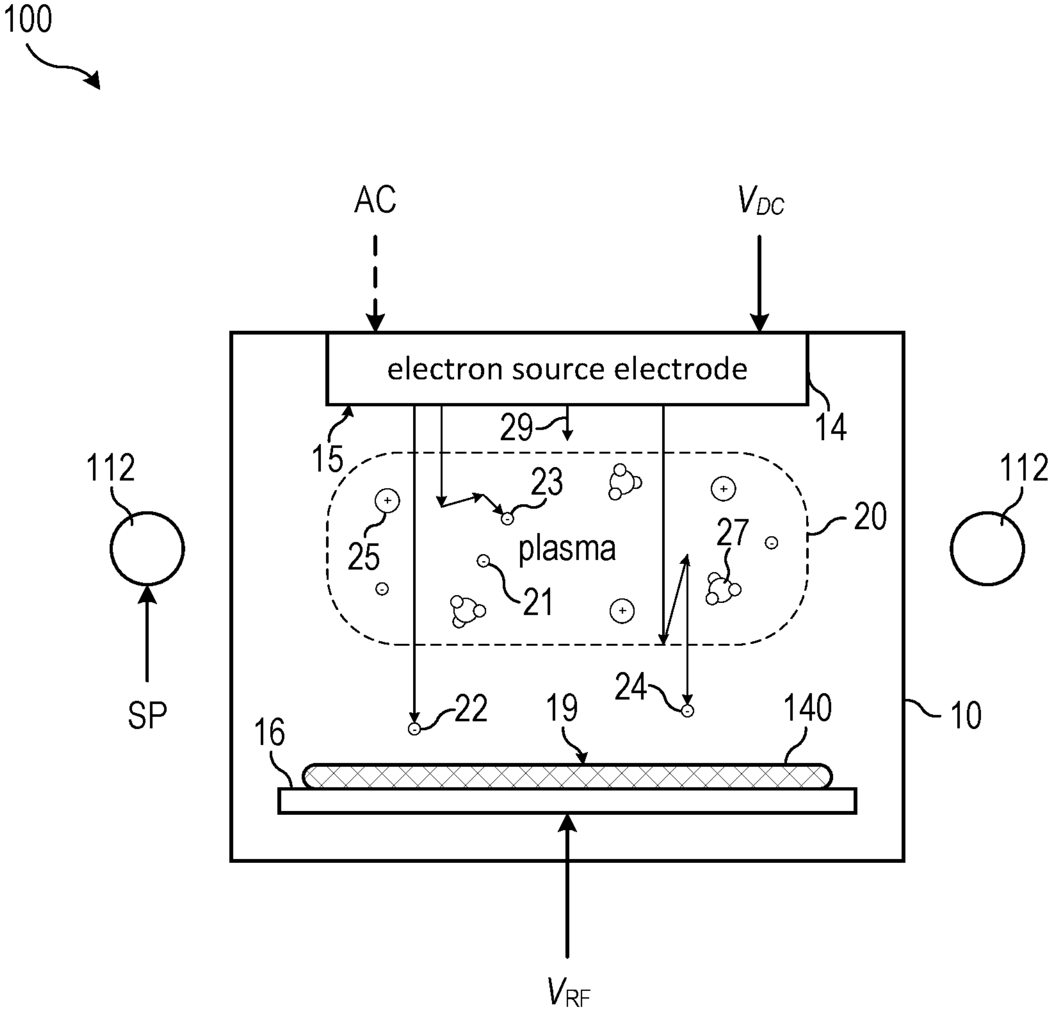
FIG. 1 illustrates a schematic diagram of an example plasma processing apparatus including an electron source electrode and a source power coupling element in accordance with an embodiment of the invention.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Precision plasma processes such as atomic layer etching (ALE) processes and atomic layer deposition (ALD) processes may utilize surface modification techniques to increase control over subsequent reactions at a substrate. Conventional surface modification techniques can be both time consuming and imprecise. For example, gas injection and processing chamber pump down times which enable and disable surface chemistry may require undesirably lengthy timescales in order to achieve desired results. Consequently, speeding up conventional surface modification steps may be possible, but only when precision is sacrificed.

During a plasma process, source power may be coupled to a source power coupling element (e.g. coils of a helical resonator) to generate a plasma. The plasma may include both reactive species and unreactive species such as electrons, ions, and radicals. Bias power may be applied to a substrate holder to couple energy to plasma species at a substrate supported by the substrate holder. An electron beam may be utilized to tailor plasma properties as well as induce reactions at a substrate surface. Advanced pulsing techniques (APT) that modulate the application of one or more of source power, bias power, electron beam generation, and gas injection during a plasma process may be advantageously enable precision control at the substrate.

Electron beam mediated processes may be used to stimulate chemistry both within a bulk plasma and also at a substrate surface. Electrons (e.g., ballistic electrons) that impinge on a substrate surface may generate dangling bonds and stimulate chemistry (e.g., polymer growth) at the substrate surface. Electrons may also penetrate deep into features at of a substrate depending on the electron energy and the materials of the substrate. Appropriate potential gradients may be used to slow down electrons in an electron beam that passes through a generated plasma so that some or all of the electrons of the beam interact within the bulk plasma. Such interactions may stimulate chemistry within the bulk plasma such as polymerization.

Electron beams can be created using existing plasma generated in a processing chamber. The existing plasma may be any suitable type of plasma such as an inductively coupled plasma (ICP), a capacitively coupled plasma (CCP), a surface wave plasma (SWP), wave heated plasma, and the like. Plasmas may be sustained by an AC power source such as a RF source, a very-high frequency (VHF) source, and others. A DC bias voltage may be applied to a conductive surface inside the processing chamber to generate the electron beam from the plasma. For example, a negative DC bias voltage may be applied to a conductive surface near an existing plasma thereby attracting positively charged ions to the conductive surface which generate an electron beam from secondary emissions caused by ion bombardment. A pulsed DC or bipolar DC bias can be applied to a dielectric surface provided the temporal duration of the pulse is shorter than the time it takes the plasma charged species flux to charge the surface and negate the electric field in front of the dielectric.

The resulting electron beam may be substantially normal to the conductive surface due to the high energy of the electrons. The DC bias voltage may directly control the generation of the electron beam. In other words, when the DC bias voltage is applied, the electron beam may be "turned on" substantially instantaneously. Similarly, when the DC bias voltage is removed, the electron beam may be "turned off" substantially instantaneously.

Chemistry such as polymer growth on a substrate surface is conventionally achieved using gas switching which may be slow and imprecise. Electron beam mediated processes may advantageously provide another way to achieve similar or improved results without drawbacks associated with gas switching. For example, gas switching cannot be easily implemented and cannot be switched at the timescales of monolayer polymer growth. In other words, gas switching may be limited to timescales that are longer than timescales associated with a single monolayer to a few monolayers of polymer growth. However, electron beams can advantageously be switched on and off at the same timescales as a single monolayer to a few monolayers of polymer growth (or even faster) using a DC biased electrode in proximity to an existing plasma. Polymerization may be tightly controlled due to the immediacy of the relationship between the DC bias voltage and the electron beam. For example, polymer generation at the substrate or in the bulk plasma may be approximately digital in nature (i.e., "on" and "off" states for polymer growth). The polymer generation rate may also be relatively low when the electron beam is off and relatively high when the electron beam is on (i.e. "high" and "low" states for polymer growth).

In various embodiments, a method of plasma processing includes continuously providing a gas into a processing chamber and AC source power to a source power coupling element for a duration. The AC source power generates a plasma in the processing chamber. A first negative bias voltage is applied to an electron source electrode while providing the gas and the AC source power. The first negative bias voltage generates an electron beam directed towards a substrate holder. The first negative bias voltage is then removed from the electron source electrode while still providing the gas and the AC power. The removal of the first negative bias voltage discontinues the generation of the electron beam. A second negative bias voltage (e.g. a DC self-bias generated by the AC power) is applied to the substrate holder for some or all of the duration.

The AC source power may be RF source power inductively coupled to the plasma. The source power coupling element may be a helical coil or a planar coil, as examples. A substrate may be immobilized by the substrate holder. The substrate may include a surface facing the electron beam. In one embodiment, the method if a plasma etching process. During the plasma etching process, a polymer layer is formed at the surface of the substrate using the electron beam and subsequently etched along with the surface of the substrate using ions of the plasma.

Embodiment methods of plasma processing described herein may advantageously enable monolayer-level control over plasma processes. For example, the embodiment methods may beneficially find application in various plasma processes involving high aspect ratio features and/or high precision requirements such as in patterning, ALD, quasi-ALD, ALE, quasi-ALE, self-aligned contact (SAC) etches, high-aspect ratio contact (HARC) etches, and others for formation of contacts, NAND structures, dynamic random access memory (DRAM), etc. The embodiment methods may also advantageously enhance profile control during plasma processes. Another possible advantage of the described embodiments may be to enable desired chemistry to be preferentially stimulated on horizontal surfaces of the substrate. The embodiment methods may further advantageously allow cyclic plasma processes with little or no gas switching. A further possible advantage of embodiments described herein is to provide atomic layer control during plasma processing even without self-limiting chemistry. Embodiment methods may also advantageously improve spatial control in area selective etching processes (e.g. SAC processes or in patterning).

Embodiments provided below describe various systems, apparatuses, and methods of plasma processing, and in particular, plasma processing that using a pulsed electron beam. The following description describes the embodiments. Two embodiment plasma processing apparatuses including an electron source electrode and a source power coupling element are described using FIG. 1 and FIG. 2. A schematic timing diagram of an embodiment method of plasma processing including a DC pulse and a bias pulse is described using FIG. 3. An embodiment method of plasma etching is described using FIG. 4. Another embodiment method of plasma processing using a DC pulse and a bias pulse is described using FIG. 5. An embodiment plasma processing system is described using FIG. 6. Two embodiment methods of plasma processing, the second be a plasma etching process, are described using FIG. 7 and FIG. 8.

FIG. 1 illustrates a schematic diagram of an example plasma processing apparatus including an electron source electrode and a source power coupling element in accordance with an embodiment of the invention.

Referring to FIG. 1, a plasma processing apparatus 100 includes a processing chamber 10 and a source power coupling element 112. The processing chamber 10 comprises a conductive material and may be grounded at all or some conductive surfaces. In some implementations, some surfaces of the processing chamber 10 may be coated with an etch-resistant dielectric material such as Y2O3, anodized aluminum, or other compound depending on the process application). In one embodiment, the source power coupling element 112 is disposed outside the processing chamber 10. Alternatively, the source power coupling element 112 may be disposed inside the processing chamber 10. The source power coupling element 112 receives source power SP which may be AC source power in various embodiments. The source power SP is coupled to the processing chamber 10 and generates a plasma 20 within the processing chamber 10.

The source power coupling element 112 is an RF coupling element in various embodiments. In one embodiment, the source power coupling element 112 is a coaxial ICP coil as shown. The source power coupling element 112 may be an inductive coil having any suitable geometry such as a cylindrical (e.g. helical) coil, a planar (e.g. spiral) coil, etc. In some embodiments, the source power coupling element 112 may be surrounded by a grounded cylindrical shield in a helical resonator configuration. Although shown surrounding sidewalls of the processing chamber 10, the source power coupling element 112 may also be disposed above or inside the processing chamber 10. For example, the source power coupling element 112 may also be an electrode disposed in the processing chamber 10 in a capacitive coupling configuration.

The plasma 20 may include a mixture of electrons 21, ions, and radicals 27. The ions may be positively or negatively charged. For example, the plasma 20 may comprise electrons 21 and positively charged ions 25. The plasma 20 may be any suitable type of plasma. In one embodiment, the plasma 20 is an ICP. In other embodiments, the plasma 20 may be a CCP, a SWP, a wave heated plasma, and others. The plasma 20 may be generated in proximity to an electron source electrode 14.

The electron source electrode 14 includes an emitter surface 15 that is disposed within the processing chamber 10. The electron source electrode 14 may be disposed entirely within the processing chamber 10 (as shown) or partially within the processing chamber. A DC bias voltage $V_{DC}$ is applied to the electron source electrode 14 to generate an electron beam 29 comprising ballistic electrons 22 within the processing chamber 10. The DC bias voltage $V_{DC}$ is a negative DC bias voltage in one embodiment. The DC bias voltage $V_{DC}$ may be continuous, pulsed or pulsed bipolar. The emitter surface 15 of the electron source electrode 15 may act as an electron emitter by attracting ions 25 of the plasma 20 to impinge on the emitter surface 15 and generate the ballistic electrons 22. The ballistic electrons 22 may have significantly higher energy than the plasma potential allowing them to pass substantially unimpeded through the plasma 20.

The electron beam 29 may be substantially normal to the emitter surface 15. For example, the DC bias voltage $V_{DC}$ may be of a sufficient value to impart a substantially vertical velocity to the ballistic electrons 22 of the electron beam 29. As illustrated, the electron beam 29 is directed toward a substrate holder 16 disposed in the processing chamber 10. The substrate holder 16 may be an electrostatic chuck, for example. A substrate 140 may be supported by the substrate holder 16. The substrate 140 includes an opposing surface 19 which may receive incident ballistic electrons 22 that pass through the plasma 20.

Optionally, AC power may also be applied to the electron source electrode 14. The optional AC power may function as an additional source for the plasma 20. The optional AC power is RF power in one embodiment. In another embodiment, the optional AC power is VHF power.

The substrate holder 16 receives a bias voltage which may be an RF bias voltage $V_{RF}$ as shown. For example, the RF bias voltage $V_R$ may prevent charging at the substrate 140 that would occur with a continuous voltage offset. The RF bias voltage $V_{RF}$ is negative in various embodiments. The RF bias voltage $V_R$ may accelerate the positively charge ions 25 or other charged species towards the opposing surface 19. The processing chamber 10 may include a return path for the bias voltage at the substrate holder 16 (another DC surface, grounded surface, or oppositely biased surface). For example, the return path may be adjacent to the electron source electrode 14 or another suitable location which may depend on the specific design requirements of a particular implementation.

The behavior (e.g. path, energy, etc.) of electrons in the electron beam 29 may depend on characteristics of the potential between the electron source electrode 14 and the substrate holder 16. For example, at least three potentials may contribute to the behavior of the electron beam 29. These three potentials may be the DC bias voltage $V_{DC}$, the plasma potential, and the RF bias voltage $V_{RF}$. The relationship between the potentials may affect the energy of the electrons in the electron beam 29 when they are in the plasma 20 leading to distinct qualitative regimes.

As shown, the electrons of the electron beam 29 may be thought of as being in three distinct regimes (the ballistic electrons 22, trapped electrons 23, and trapped and dumped electrons 24). The ballistic electrons 22 may be generated when the DC bias voltage $V_{DC}$ is much greater than the combination of the plasma potential and the peak-to-peak average of the RF bias voltage $V_{RF}$. The energy of the ballistic electrons 22 may be sufficiently large as to reduce or effectively eliminate the interaction cross-section of the ballistic electrons 22 with species in the plasma 20. Consequently, the ballistic electrons 22 may pass through the plasma substantially unimpeded and reach the opposing surface 19 with sufficient energy to break bonds and/or change reactivity at the substrate 140.

The trapped electrons 23 may be generated when the DC bias voltage $V_{DC}$ is much less than the combination of the plasma potential and the peak-to-peak average of the RF bias voltage $V_{RF}$. In this regime, the energy of the electrons in the electron beam 29 is sufficiently small so as to be retarded and "trapped" within the plasma 20. The trapped electrons 23 may have a large interaction cross-section with species in the plasma 20 making many collisions with the neutral gas. Further, the trapped electrons 23 may be slowed such that the energy of the trapped electrons 23 is comparable to the plasma potential.

The trapped and dumped electrons 24 can be considered to be in a "mixed state" between the ballistic and trapped regimes. The trapped and dumped electrons 24 may be generated when the DC bias voltage $V_{DC}$ is comparable (e.g. slightly higher) to the combination of the plasma potential and the RF bias voltage $V_{RF}$. In this regime, the electrons of the electron beam 20 have a non-negligible interaction cross-section with species in the plasma 20. In other words, the trapped and dumped electrons 24 may have sufficient energy to pass through the plasma 20 without interacting or maintain a trajectory toward the substrate holder 16 even after interacting within the plasma 20. In the trapped and dumped regime, electrons of the electron beam 29 may have energy such that a fraction of the electrons pass straight through the plasma 20, a fraction of the electrons are fully trapped in the plasma 20, and a remaining fraction interact and then leave the plasma 20. As a result the angular distribution of the electrons passing through the plasma 20 in the trapped and dumped regime is higher than that of the electrons passing through the plasma 20 in the ballistic regime.

As an example of the ballistic regime, the DC bias voltage $V_{DC}$ may be about 500 V, the RF bias voltage $V_{RF}$ may be off, and the plasma potential may be about 30 V. In this case, the substantial majority of electrons of the electron beam 29 will be ballistic electrons 22 that reach the opposing surface 19 with energies near 470 V. In this regime, virtually no interactions may occur between the electron beam 29 and the plasma 20. However, the ballistic electrons 22 impinging on the opposing surface 19 of the substrate 140 may be sufficient energy to generate dangling bonds and stimulate chemistry (e.g. polymer formation).

As an example of the trapped regime, the DC bias voltage $V_{DC}$ may be about 500 V, the plasma potential may be about 30 V, and the peak-to-peak RF bias voltage $V_{RF}$ may be about 650 V. In this regime, the substantial majority of the electrons of the electron beam 29 will remain in the plasma as trapped electrons 23. For example, the trapped electrons 23 may facilitate bulk plasma polymerization (e.g. fluorocarbon fragments). The dissociation of the plasma 20 may also be controlled using the trapped electrons 23. For example, a weak plasma source may have a small degree of dissociation allowing polymerization to be controlled by the electron beam 29 rather than the source power.

Figure 2:
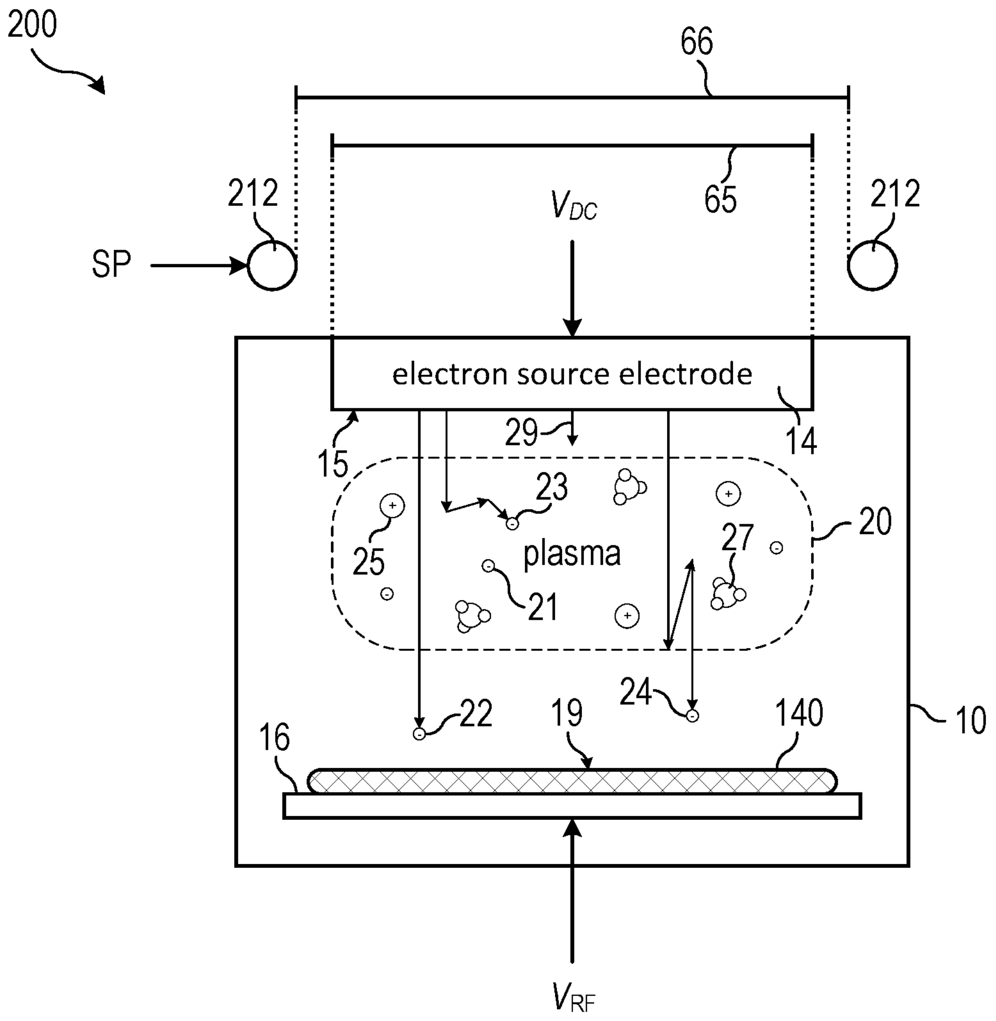
FIG. 2 illustrates a schematic diagram of another example plasma processing apparatus including an electron source electrode and a source power coupling element in accordance with an embodiment of the invention.

FIG. 2 illustrates a schematic diagram of another example plasma processing apparatus including an electron source electrode and a source power coupling element in accordance with an embodiment of the invention. The plasma processing apparatus of FIG. 2 may be an alternative configuration (e.g., share features that may be in a different arrangement) of other plasma processing apparatuses described herein, such as the plasma processing apparatus 100 of FIG. 1, for example. Similarly labeled elements may be as previously described.

Referring to FIG. 2, a plasma processing apparatus 200 includes an electron source electrode 14 and a substrate holder 16 disposed in a processing chamber 10, all of which may be as previously described. In contrast to the plasma processing apparatus 100 illustrated in FIG. 1, the plasma processing apparatus 200 includes a source power coupling element 212 that is disposed outside and over the processing chamber 10. The source power coupling element 212 may be a specific implementation of the source power coupling element 112 of FIG. 1. The source power coupling element 212 may be a planar induction coil.

In one embodiment, the source power coupling element 212 is a pancake induction coil disposed over the processing chamber 10 in a pancake ICP configuration. A DC biased faraday cage may be disposed between the pancake induction coil and the electron source electrode 14 to diminish or eliminate coupling there between. Another method of suppressing current coupling between a coil and other metallic surfaces may be to include grooves in the surfaces to of the electron source electrode 14 facing the coil to increase the impedance. The DC bias voltage $V_{DC}$ may be pulsed at a sufficient rate to avoid charging of a quartz window. Alternatively or additionally, the electron source electrode 14 may include structural decoupling mechanisms such as slots to impede an image current. The electron source electrode 14 may also include a DC surface configured to act as a faraday shield.

Coupling between the source power coupling electrode 212 and the electron source electrode 14 may also be further reduced by arranging the source power coupling electrode 212 outside an outer diameter 65 of the electron source electrode 14 as shown. In other words, an inner diameter 66 of the source power coupling electrode 212 may be larger than the outer diameter 65.

Figure 3:
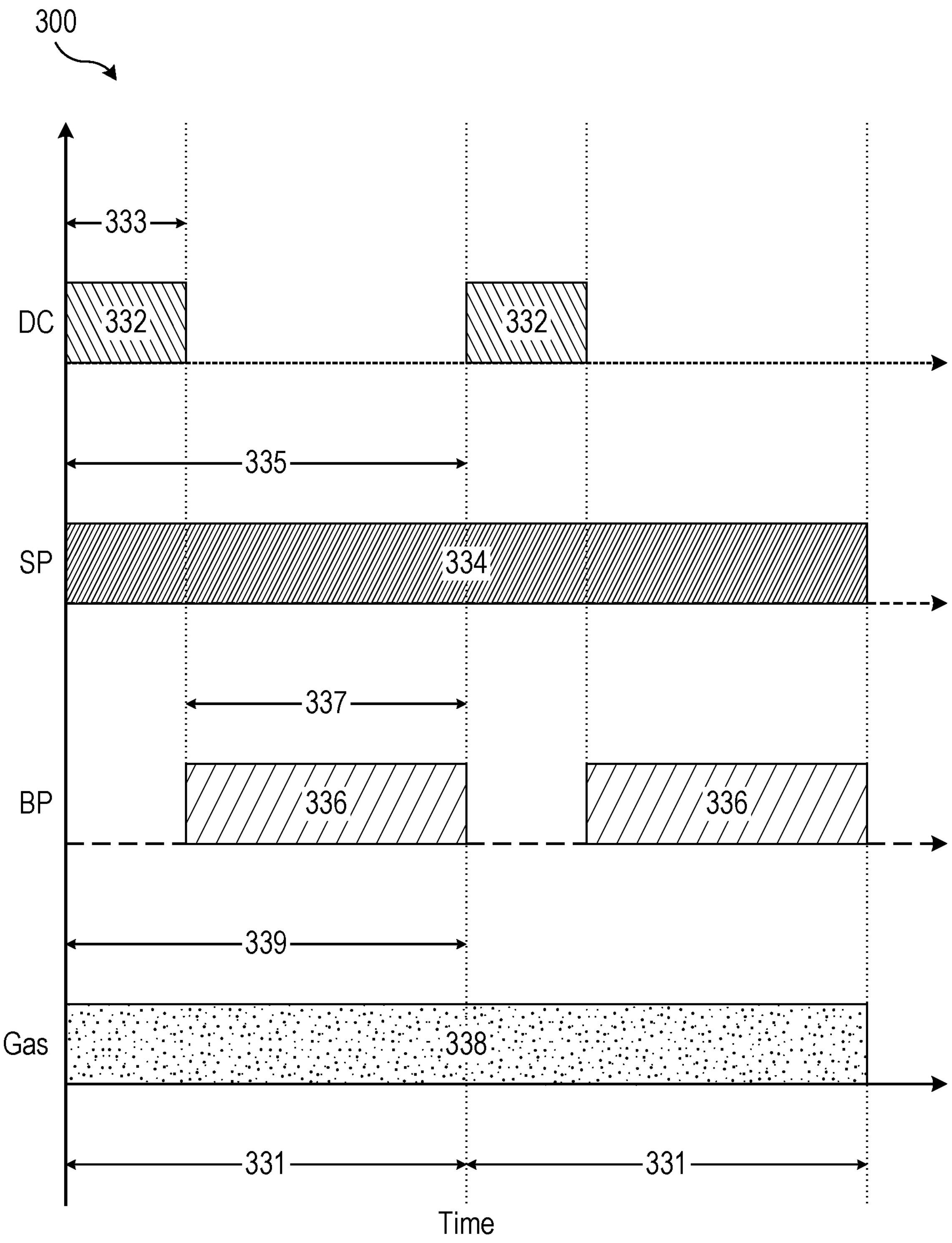
FIG. 3 illustrates a schematic timing diagram of an example method of plasma processing including a direct current pulse and a bias pulse in accordance with an embodiment of the invention.

FIG. 3 illustrates a schematic timing diagram of an example method of plasma processing including a direct current pulse and a bias pulse in accordance with an embodiment of the invention. The schematic timing diagram may represent a method of plasma processing as performed by any of the plasma processing apparatuses or plasma processing systems described herein such as the plasma processing apparatus 100 of FIG. 1 or the plasma processing apparatus 200 of FIG. 2, as examples.

Referring to FIG. 3, a schematic timing diagram 300 includes source pulses 334 indicating the application of source power SP to a source power coupling electrode, DC pulses 332 indicating the application of DC power to an electron source electrode, and bias pulses 336 indicating the application of bias power BP to a substrate holder. The schematic timing diagram 300 may also include gas pulses 338 indicating the injection of gas into a processing chamber. For example, as shown, the gas pulses 338 may be continuous because gas pulses may be at a longer time scale in principle (on the order of at least the residence time). The pulses may be cyclically applied to a plasma processing apparatus during a plasma process. For example, the pulses may be applied periodically so that a pulse pattern is repeated over a pulse period 331 as shown.

The source power SP may be continuously applied as shown. For example, the source pulses 334 may have a source pulse duration 335 equal to the pulse period 331. Additionally or alternatively, the source power SP may be pulsed such that the source pulse duration is less than the pulse period 331. Similarly, gas may be injected continuously having a gas pulse duration 339 equal to the pulse period 331 or may also be adjusted within a pulse period 331. In one embodiment, both the source power SP and the gas are continuously applied during the plasma process.

The DC power is switched on for a portion of the pulse period 331. Specifically, the DC pulses 332 have a DC pulse duration 333 that is less than the pulse period 331. For example, the DC pulse duration 333 may advantageously be smaller than the gas switching speeds attainable in conventional plasma processes. The DC pulses 332 are used to generate an electron beam in a processing chamber. The electron beam is generated (i.e. "switched on") substantially instantaneously with the application of the DC power and discontinued (i.e. "switched off") substantially instantaneously with the removal of the DC power. For example, when the DC power is switched off, the electron source electrode may be coupled to a ground potential.

The DC pulse duration 333 may be on order of the gas residence time. In various embodiments, the DC pulse duration 333 is less than about 500 ms. For example, the DC pulse duration 333 may be between about 100 ms and about 3 s. In one embodiment, the DC pulse duration 333 is about 100 ms. In another embodiment, the DC pulse duration 33 is about 1 ms. The DC pulse duration 333 may also be greater than 3 s in some embodiments.

The bias power BP may be continuously applied or switched on for a portion of the pulse period 331. As previously noted, the bias power BP may be RF power with a DC offset. In various embodiments, the bias pulses 336 have a bias pulse duration 337 that is less than the pulse period 331. In some embodiments, each of the bias pulses 336 begin after the DC pulse duration 333 within each pulse period 331. For example, the each of the bias pulses 336 may begin directly after the conclusion of corresponding DC pulses 332 (as shown) or may be also be delayed. Additionally, the bias pulse duration 337 need not extend to the end of each pulse period 331. For example, an interval during which both the DC power and the bias power BP are off may exist before and/or after each of the bias pulses 336.

Figure 4:
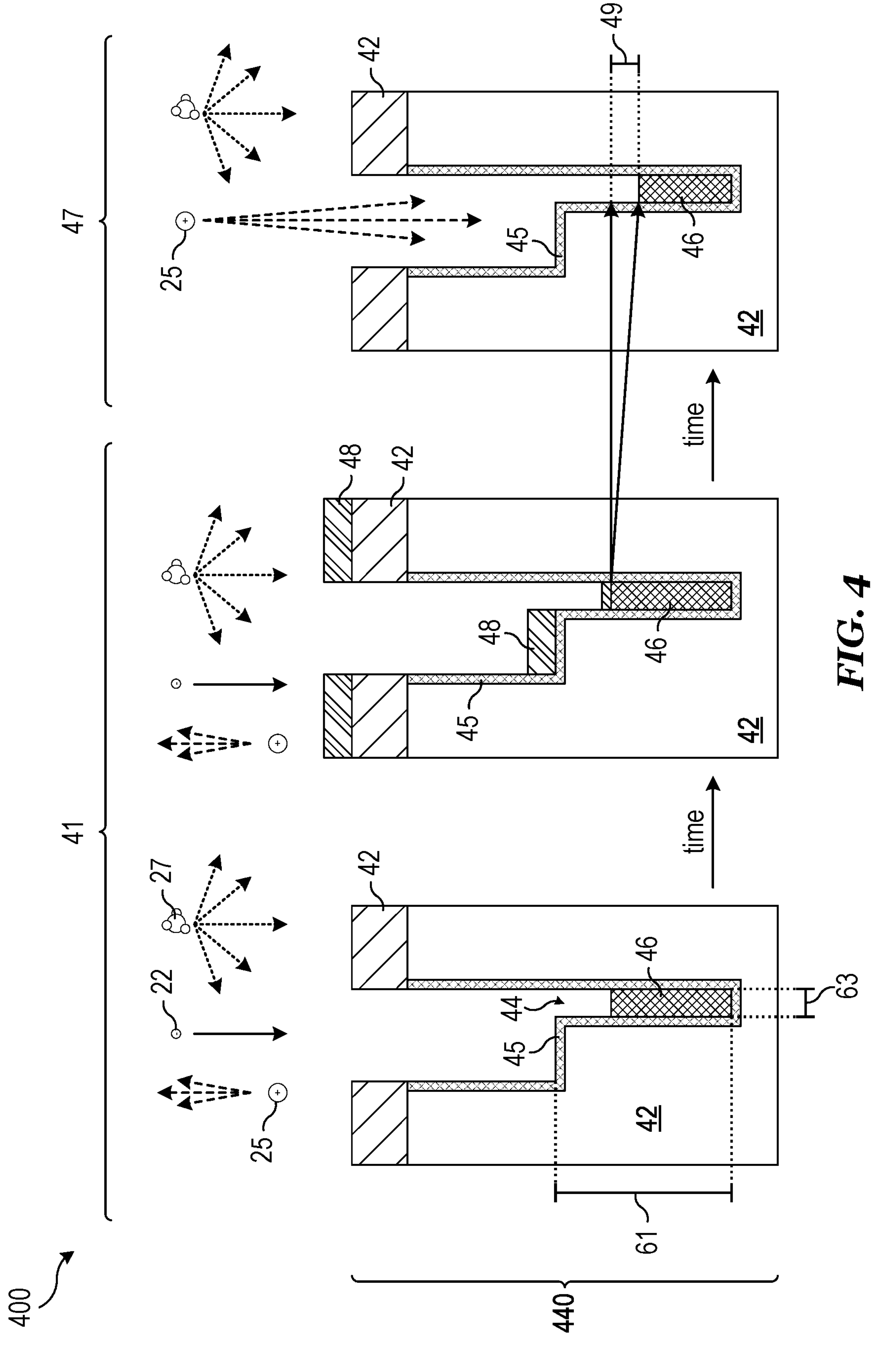
FIG. 4 illustrates a schematic diagram of an example method of plasma etching including forming a polymer layer at a substrate using an electron beam and etching the polymer layer along with the substrate in accordance with an embodiment of the invention.

FIG. 4 illustrates a schematic diagram of an example method of plasma etching including forming a polymer layer at a substrate using an electron beam and etching the polymer layer along with the substrate in accordance with an embodiment of the invention. The method of plasma etching may be a specific implementation of example methods of plasma processing as described herein, such as the method of plasma processing of FIG. 3, for example.

Referring to FIG. 4, a method of plasma etching 400 includes a beam-on phase 41 during which an electron beam directed toward a substrate 440 is generated within a processing chamber, and a beam-off phase 47 during which the electron beam is switched off and positively charge ions 25 are attracted toward the substrate 440. The method of plasma etching 400 may be applied to any suitable etching process including specific types of etching processes. In one embodiment, the method of plasma etching may be a SAC etching process. Alternatively, the method of plasma etching 400 may be a HARC etching process.

Various features may be included within the substrate 440 such as high aspect ratio features 44 including a lateral dimension 63 that is much smaller than a vertical dimension 61. For example, the high aspect ratio features 44 may be trenches, holes, or any suitable shape with regions of small lateral dimensionality and large vertical dimensionality. In various embodiments, the aspect ratio of the high aspect ratio features 44 (e.g. the vertical dimension 61 divided by the lateral dimension 63) is greater than about 25. In some embodiments, the aspect ratio of the high aspect ratio features 44 is greater than about 50 and is about 100 in one embodiment.

A mask 43 may be disposed over a bulk material 42 of the substrate 440. A thin conformal layer 45 may be disposed over various surfaces of the bulk material 42 such as the sidewalls and bottom surfaces of the high aspect ratio features 44 as shown. In one embodiment, the thin conformal layer 45 is a thin nitride layer. The high aspect ratio features 44 may be filled with a fill layer 46. The fill layer 46 may be the target material to be etched during the plasma etching process. In one embodiment, the fill layer 46 is an oxide fill layer.

During the beam-on phase 41, ballistic electrons 22 impinge at exposed surfaces of the substrate 440. The ballistic electrons 22 may be substantially vertical relative to horizontal surfaces such as exposed surfaces of the mask 43, the thin conformal layer 45, and the fill layer 46. Positively charge ions 25 are accelerated away from the substrate 440 during the beam-on phase 41 while the movement of radicals 27 (e.g. uncharged species) may be dominated by diffusive effects.

As a result of the incident ballistic electrons 22, a polymer layer 48 may be grown on surfaces of the substrate 440 during the beam-on phase 41. The vertical nature of the ballistic electrons 22 may advantageously promote polymer growth primarily or entirely on horizontal surfaces of the substrate 440 as shown. The polymer layer 48 may be used to protect underlying materials that are not specifically targeted by the plasma etching process such as the mask 43 and the thin conformal layer 45. For example the geometry (e.g. corners) of the thin conformal layer 45 may be protected by the polymer layer 48.

The growth of the polymer layer 48 may be tightly controlled by the application of a DC bias voltage to an electron source electrode. For example, the high aspect ratio features 46 may advantageously remain open even after polymer has been grown on the thin conformal layer 45 and the fill layer 46. By comparison, conventional plasma etching processes may disadvantageously "pinch off" high aspect ratio features resulting in reduced etching effectiveness of materials within the features.

After the beam-on phase 41, the electron beam comprising the ballistic electrons 22 is turned off (e.g. by removing a DC bias voltage from an electron source electrode). Exposed surfaces of the substrate 440 are then etched during the beam-off phase 47. Accordingly, the beam-on phase 41 may be considered a DC bias phase or a ballistic electron mode while the beam-off phase 47 may be considered an etching phase or a high energy ion phase of the method of plasma etching 400. For example, bias power may be applied to a substrate holder to accelerate positively charged ions 25 to the substrate 440 during the beam-off phase 47. The polymer layer 48 and the fill layer 46 are etched during the beam-off phase 47.

Appropriate chemistry may exist between the polymer layer 48 and the fill layer 46 so that the amount of the fill layer 46 that is removed is controllable. The quantity of polymer grown on the fill layer 46 may be advantageously controlled by the duration of the beam-on phase 41. A desired etch depth 49 of the fill layer 46 may then be achieved during the beam-off phase 47. In various embodiments, the etch depth 49 is less than three monolayers of the fill layer 46. In one embodiment, the etch depth 49 is substantially one monolayer of the fill layer 46. The beam-on phase 41 and the beam-off phase 47 may be cyclically performed in order to precisely etch the fill layer 46 without substantially altering the mask 43 and/or the thin conformal layer 45.

The method of plasma etching 400 may advantageously induce surface chemistry of the substrate 440 without gas switching steps. The duration of the beam-on phase 41 may beneficially be similar or the same as the time to grow a single monolayer of polymer (e.g. on the fill layer 46). For example, the duration of the beam-on phase 41 may be comparable to the residence time of the gas at the substrate 440.

As a specific example, fluorocarbons, which can be used to etch oxides (e.g. in SAC etches), may grow on themselves and enlarge the geometry of protective nitride layers (e.g. at corners) in conventional plasma etching processes. This departure from the underlying nitride geometry can be problematic near openings with small dimensionality (e.g. when the lateral dimension 63 is about 10-20 nm) such as for the high aspect ratio features 44. For example, the uncontrolled additional fluorocarbon polymerization during conventional plasma etching processes may plug the openings of the high aspect ratio features 44.

Since the nitride layer is masking the oxide layer, the result of such plugged features is prevention of the desired oxide etch during the etching phase. However, in the method of plasma etching 400 and other embodiment methods of plasma processing, the digital (or near-digital) control of the electron beam (and consequently the induced surface chemistry and/or bulk plasma chemistry) at the timescales of monolayer formation may advantageously reduce or eliminate geometrical artifacts thereby preventing plugging of the high aspect ratio features 44. These and similar advantages may also be generally realized in plasma processes such as ALD, quasi-ALD, ALE, quasi-ALE, HARC, NAND device formation, DRAM device formation, and others.

Figure 5:
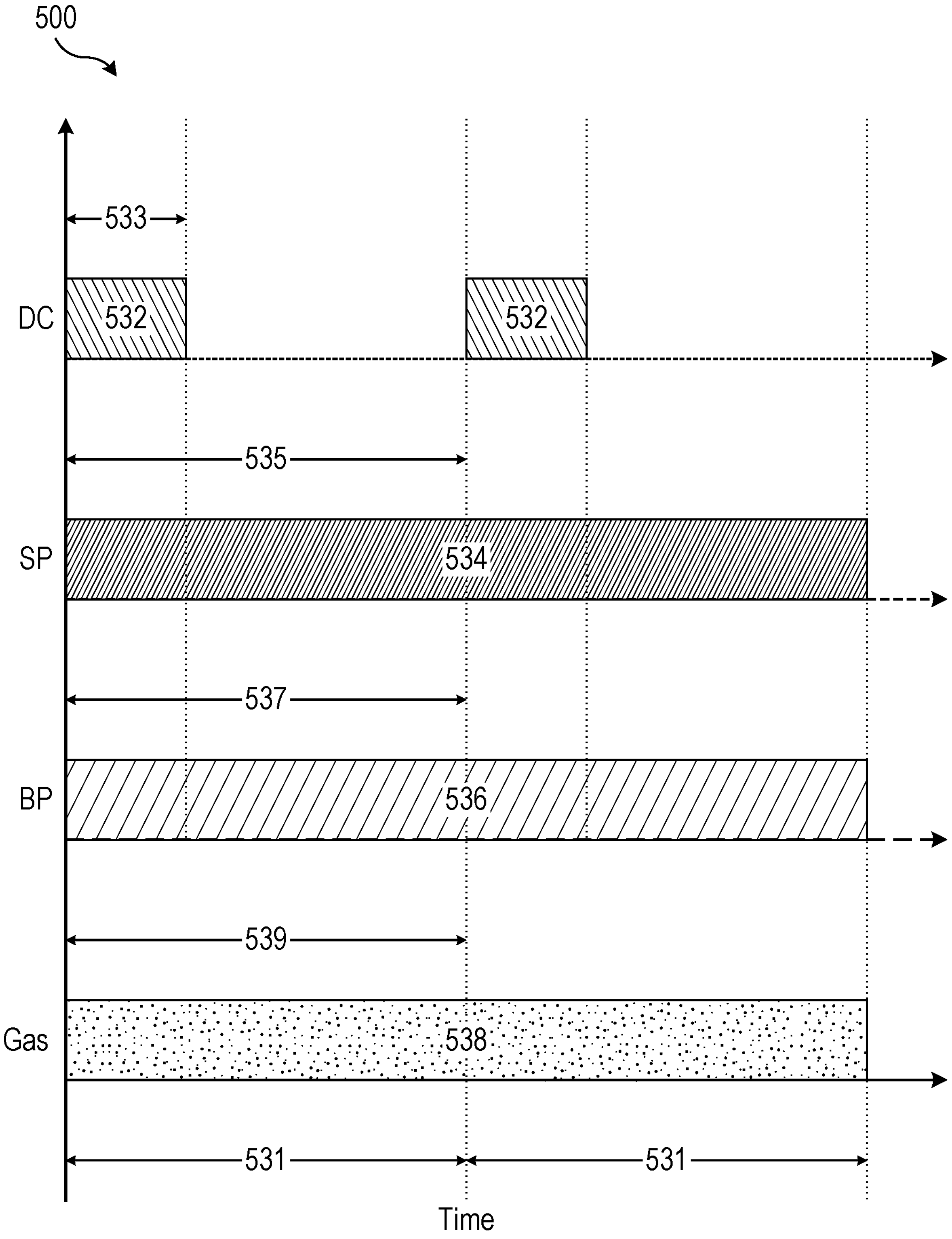
FIG. 5 illustrates a schematic timing diagram of another example method of plasma processing including a direct current pulse and a bias pulse in accordance with an embodiment of the invention.

FIG. 5 illustrates a schematic timing diagram of another example method of plasma processing including a direct current pulse and a bias pulse in accordance with an embodiment of the invention. The schematic timing diagram of FIG. 5 may represent a method of plasma processing as performed by any of the plasma processing apparatuses or plasma processing systems described herein such as the plasma processing apparatus 100 of FIG. 1 or the plasma processing apparatus 200 of FIG. 2, as examples.

Referring to FIG. 5, a schematic timing diagram 500 may be a specific implementation of the schematic timing diagram 300 of FIG. 3 where bias power BP is applied concurrently with DC power. As shown, the schematic timing diagram 500 includes source pulses 534 with source pulse duration 535, DC pulses 532 with DC pulse duration 533, and bias pulses 536 with bias pulse duration 537. Gas may also be injected as gas pulses 538 having a gas pulse duration 539.

The DC pulse duration is less than a pulse period 531, while the source pulse duration 535 and the bias pulse duration 537 are equal to the pulse period 531. Alternatively, the bias pulses 536 may be applied during the DC pulses 532, but still might be shorter than the pulse period 531 (i.e. ending before the expiration of each pulse period 531 and/or delayed with respect to the start of each pulse period 531). As still another alternative, multiple bias pulses 536 may be applied during each pulse period 531. For example, one bias pulse may be delivered concurrently with a DC pulse while another bias pulse is delivered when the DC power is off.

Applying bias power BP during the DC pulse 536 may be advantageously used to modulate the regime of the electrons in the generated electron beam and tailor induced chemical interactions within the bulk plasma and/or at the surface of the substrate. It should be noted that the bias power BP while the DC power is on may be the same or different as the DC power when the DC power is off.

Figure 6:
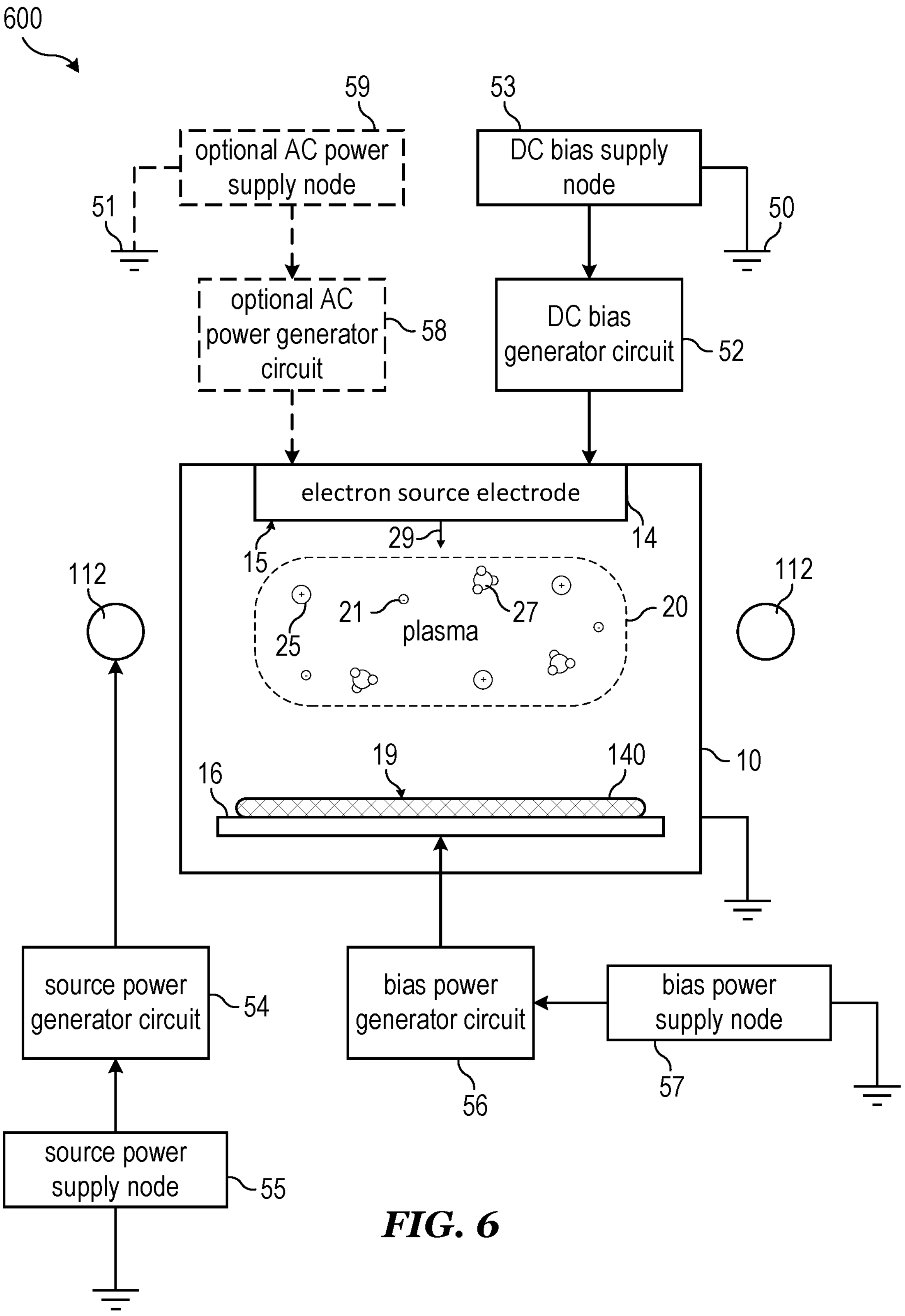
FIG. 6 illustrates a schematic diagram of an example plasma processing system including an electron source electrode coupled to a direct current bias supply node and a source power coupling element coupled to a source power supply node in accordance with an embodiment of the invention.

FIG. 6 illustrates a schematic diagram of an example plasma processing system including an electron source electrode coupled to a direct current bias supply node and a source power coupling element coupled to a source power supply node in accordance with an embodiment of the invention. The plasma processing system of FIG. 6 may include any of the plasma processing apparatuses as described herein such as the plasma processing apparatus 100 of FIG. 1 or the plasma processing apparatus 200 of FIG. 2, as examples. Similarly labeled elements may be as previously described.

Referring to FIG. 6, the plasma processing system 600 includes an electron source electrode 14 with an emitter surface 15 disposed in a processing chamber 10. The electron source electrode 14 is coupled to a DC bias generator circuit 52 which is in turn coupled to a DC bias supply node 53 that is coupled to a ground connection 50. The electron source electrode 14 may be coupled to an optional AC power supply node 59 through an optional AC power generator circuit 58. The optional AC power supply node 59 may be coupled to an optional ground connection 51 that may be the ground connection 50 in some embodiments. As previously described, the AC power supply node 59 may supply RF power, VHF power, or any other suitable AC power.

The plasma processing system 600 also includes a source power coupling element 112 coupled to a source power supply node 55 through a source power generator circuit 54, and a substrate holder 16 coupled to a bias power supply node 57 through a bias power generator circuit 56. The source power supply node 55 and the bias power supply node 57 may also be ground through the ground connection 50 or isolated ground connections.

Although shown as separate circuits, one or more of the generator circuits and/or the supply nodes may be combined as desired depending on specific design parameters of a given application. Additionally, some or all of surfaces of the processing chamber 10 may be grounded. The ground connections may be a common ground connection, a reference ground, or reference potential.

Figure 7:
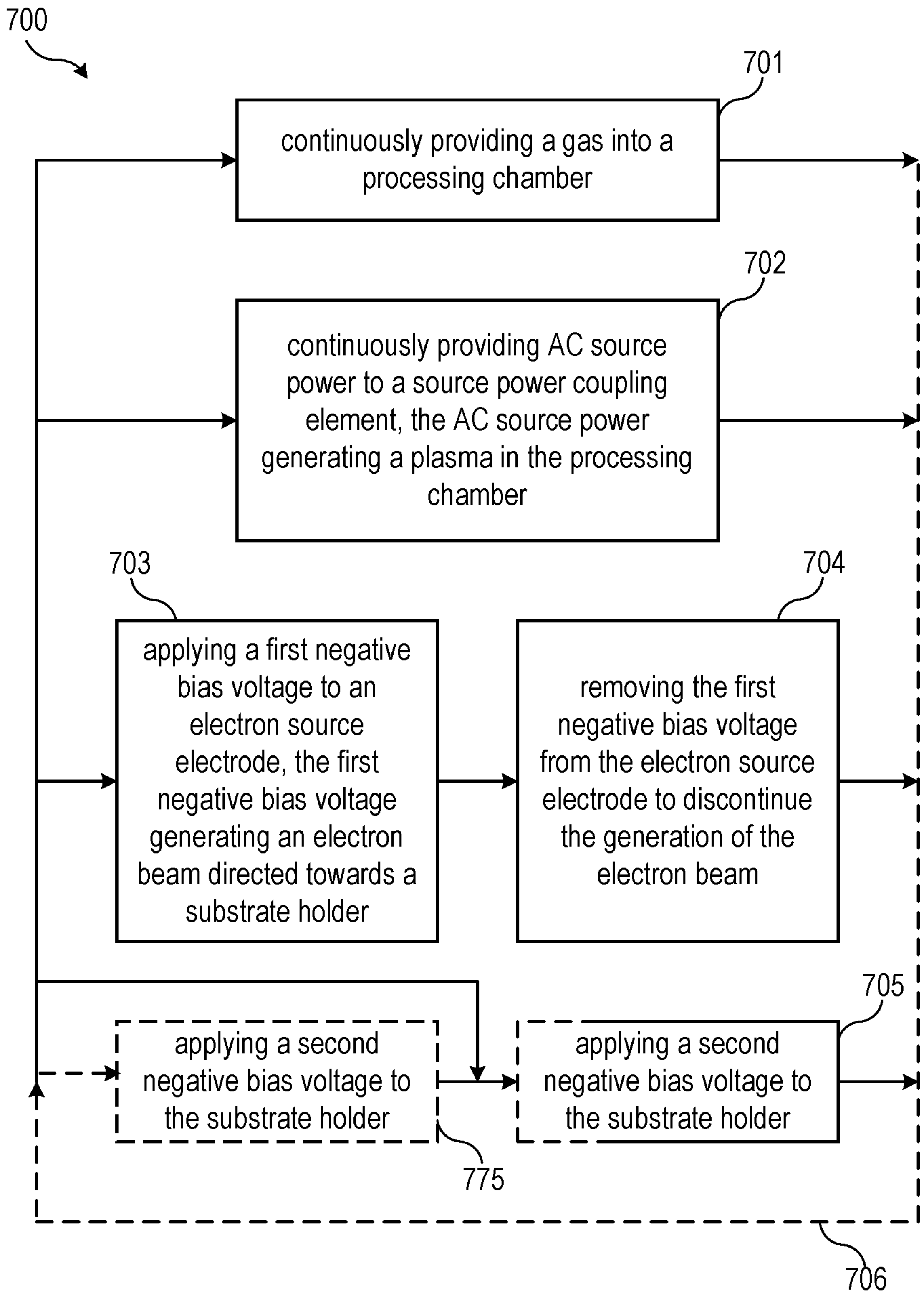
FIG. 7 illustrates an example method of plasma processing in accordance with an embodiment of the invention.

FIG. 7 illustrates an example method of plasma processing in accordance with an embodiment of the invention. The method FIG. 7 may be performed by any of the embodiment plasma processing apparatuses or plasma processing systems described herein such as the plasma processing apparatus 100 of FIG. 1, the plasma processing apparatus 200 of FIG. 2, or the plasma processing system 600 of FIG. 6, as examples. Further, the schematic timing diagrams described herein such as the schematic timing diagram 300 of FIG. 3 or the schematic timing diagram 500 of FIG. 5 may correspond with some or all of the method of FIG. 7.

Referring to FIG. 7, a method 700 includes a step 701 of continuously providing a gas into a processing chamber performed concurrently with a step 702 of continuously providing AC source power to a source power coupling element, the AC source power generating a plasma in the processing chamber. For example, steps 701 and 702 may be performed for a first duration.

While performing steps 701 and 702, the method 700 further includes a step 703 of applying a first negative bias voltage to an electron source electrode is performed. The first negative bias voltage generates an electron beam directed towards a substrate holder. The first negative bias voltage is applied for a second duration that is less than the first duration.

After performing step 703, a step 704 of removing the first negative bias voltage from the electron source electrode to discontinuing the generation of the electron beam is performed. The step 704 may have a third duration that is less than the first duration. In one embodiment, the first duration is equal to the sum of the second duration and the third duration.

While performing steps 701 and 702, the method 700 also includes a step 705 of applying a second negative bias voltage to the substrate holder. The step 705 is continuously performed during the first duration in one embodiment (e.g., optional step 775 during which the second negative bias voltage is applied concurrently with step 703, similar to the bias pulse 536 of FIG. 5, for example). Alternatively, the step 705 may be performed for a fourth duration that begins after the first duration. In one embodiment, the fourth duration begins concurrently with step 704 and is equal to the third duration (similar to the bias pulse 336 of FIG. 3, for example).

Optionally, the method 700 may be repeated by performing a step 706 of repeating the steps 701, 702, 703, 704, and 705. The optional step 706 may be repeated as necessary to cyclically perform the method 700. In some embodiments during the cyclic performance of the method 700, one or more of the gas provided in step 701, the AC source power provided in step 702, or the second negative bias voltage provided in step 705 (e.g. when applied continuously) may be modulated (e.g. pulsed) on timescales substantially greater than the first duration.

Figure 8:
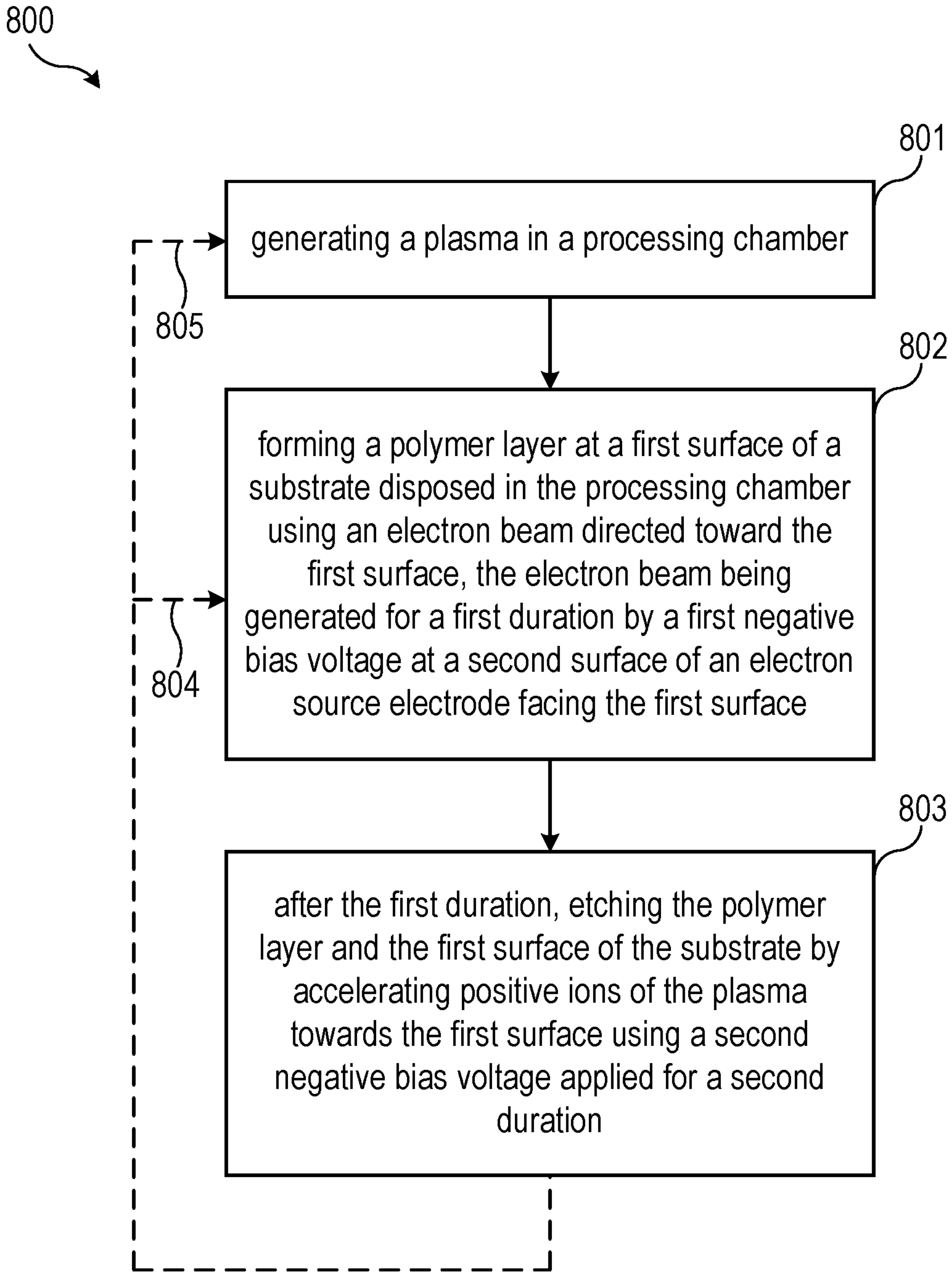
FIG. 8 illustrates an example method of plasma etching in accordance with an embodiment of the invention.

FIG. 8 illustrates an example method of plasma etching in accordance with an embodiment of the invention. The method of FIG. 8 may be performed by any of the embodiment plasma processing apparatuses or plasma processing systems described herein such as the plasma processing apparatus 100 of FIG. 1, the plasma processing apparatus 200 of FIG. 2, or the plasma processing system 600 of FIG. 6, as examples. Further, the schematic timing diagrams described herein such as the schematic timing diagram 300 of FIG. 3 or the schematic timing diagram 500 of FIG. 5 may correspond with some or all of the method of FIG. 8. The method of FIG. 8 may be a specific implementation of the method 700 of FIG. 7.

Referring to FIG. 8, a method 800 includes a step 801 of generating a plasma in a processing chamber. In various embodiments, the plasma is an ICP. After generating the inductively coupled plasma, the method includes a step 802 of forming a polymer layer at a first surface of a substrate disposed in the processing chamber using an electron beam directed toward the first surface. The electron beam is generated for a first duration by a first negative bias voltage at a second surface of an electron source electrode facing the first surface.

After the first duration, the method 800 further includes a step 803 of etching the polymer layer and the first surface of the substrate by accelerating positive ions of the plasma towards the first surface using a second negative bias voltage applied for a second duration.

Some or all of steps 801, 802, and 803 may then be repeated. For example, after the initial plasma generation in step 801, the plasma may be continuously generated while an optional step 804 of performing steps 802 and 803 is repeatedly performed. In other words, the method 800 comprises repeatedly forming a polymer layer and subsequently etching the polymer layer and a surface of the substrate. Alternatively or additionally, plasma generation may be discontinued at some point after step 803 is performed. In this case an optional step 805 of returning to step 801 may be performed in order to cyclically perform the method 800.

Example embodiments of the invention are summarized here. Other embodiments can also be understood from the entirety of the specification as well as the claims filed herein.

Example 1. A method of plasma processing including cyclically performing the following steps: continuously providing a gas into a processing chamber for a first duration; while providing the gas, continuously providing AC source power to a source power coupling element for the first duration, the AC source power generating a plasma in the processing chamber; while providing the gas and the AC source power, applying a first negative bias voltage to an electron source electrode for a second duration, the first negative bias voltage generating an electron beam directed towards a substrate holder, at the end of the second duration, removing the first negative bias voltage from the electron source electrode for a third duration to discontinue the generation of the electron beam; while providing the gas and the AC power, applying a second negative bias voltage to the substrate holder; and wherein the first duration is equal to the sum of the second duration and the third duration.

Example 2. The method of example 1, wherein applying the second negative bias voltage includes: after the second duration, applying the second negative bias voltage to the substrate holder for a fourth duration, the fourth duration being less than the first duration.

Example 3. The method of example 2, wherein the fourth duration is equal to the third duration, and wherein the second negative bias voltage is applied at the end of the second duration.

Example 4. The method of one of examples 1 to 3, wherein applying the second negative bias voltage includes: continuously applying the second negative bias voltage to the substrate holder for the first duration.

Example 5. The method of example 4, wherein, the second negative bias voltage is at a first value during the second duration and the second negative bias voltage is at a second value different from the first value during the third duration.

Example 6. The method of one of examples 1 to 5, wherein the second duration is less than about 3 ms.

Example 7. The method of one of examples 1 to 6, wherein the first negative bias voltage is a substantially constant DC voltage, and wherein applying the second negative bias voltage includes applying a radio frequency signal including a negative DC offset to the substrate holder.

Example 8. A method of plasma etching, including: generating an inductively coupled plasma in a processing chamber; forming a first polymer layer at a first surface of a substrate disposed in the processing chamber using a first electron beam directed toward the first surface, the first electron beam being generated for a first duration by a first negative bias voltage at a second surface of an electron source electrode facing the first surface; and after the first duration, etching the first polymer layer and the first surface of the substrate by accelerating positive ions of the inductively coupled plasma towards the first surface using a second negative bias voltage applied for a second duration.

Example 9. The method of example 8, further including: applying the second negative bias voltage during the first duration, the second negative bias voltage being less than the first negative bias voltage.

Example 10. The method of one of examples 8 and 9, wherein the method of plasma etching is an ALE process.

Example 11. The method of one of examples 8 to 10, wherein the method of plasma etching is a SAC etching process.

Example 12. The method of one of examples 8 to 11, wherein the first surface of the substrate is an exposed surface of a fill material disposed in a recessed region including a high aspect ratio.

Example 13. The method of example 12, wherein the high aspect ratio is greater than about 50.

Example 14. The method of one of examples 8 to 13, further including: forming a second polymer layer at a third surface of the substrate using a second electron beam directed toward the third surface, the second electron beam being generated for a third duration by a third negative bias voltage at the second surface, wherein the third surface is an etched surface formed by the etching of the first polymer layer and the first surface; and after the third duration, etching the second polymer layer and the third surface of the substrate by accelerating positive ions of the inductively coupled plasma towards the third surface using a fourth negative bias voltage applied for a fourth duration.

Example 15. A plasma processing apparatus including: a processing chamber; a first DC power supply node; an electron source electrode coupled to the first DC power supply node and including a first surface, the electron source electrode being configured to generate a pulsed electron beam in the processing chamber using a first pulsed DC bias potential supplied to the electron source electrode by the first DC power supply node, wherein the first surface is inside the processing chamber; a substrate holder disposed in the processing chamber, the substrate holder including a second surface facing the first surface; and a RF source power coupling element disposed outside the processing chamber configured to inductively couple RF source power to a plasma generated within the processing chamber.

Example 16. The plasma processing apparatus of example 15, wherein the RF source power coupling element is an induction coil disposed around the processing chamber.

Example 17. The plasma processing apparatus of one of examples 15 and 16, wherein the RF source power coupling element is a helical resonator.

Example 18. The plasma processing apparatus of one of examples 15 to 17, wherein the RF source power coupling element is an induction coil disposed above the processing chamber.

Example 19. The plasma processing apparatus of one of examples 15 to 18, wherein the substrate holder is coupled to a second DC power supply node configured to supply a second pulsed DC bias potential.

Example 20. The plasma processing apparatus of one of examples 15 to 19, further including: an AC power supply node coupled to the electron source electrode, the electron source electrode being further configured to couple AC power to the plasma.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of plasma processing, comprising:

continuously providing a single gas into a processing chamber for a continuous duration without gas switching;

during the continuous duration, generating an inductively coupled plasma in the processing chamber;

during the continuous duration, applying a first negative bias voltage at a first surface of an electron source electrode facing a second surface of a substrate disposed in the processing chamber, the first negative bias voltage generating a first electron beam comprising ballistic electrons directed toward and impinging on the second surface for a first duration, the first electron beam forming a first polymer layer at the second surface;

removing the first negative bias voltage from the electron source electrode at the end of the first duration to discontinue the generation of the first electron beam for a second duration; and after the first duration and during the continuous duration, applying a second negative bias voltage to a substrate holder supporting the substrate during the second duration, the second negative bias voltage etching the first polymer layer and the second surface of the substrate by accelerating positive ions of the inductively coupled plasma towards the second surface, wherein the first negative bias voltage is a substantially constant DC voltage, and wherein applying the second negative bias voltage comprises applying a radio frequency signal comprising a negative DC offset to the substrate holder.

2. The method of claim 1, further comprising:

applying the second negative bias voltage during the first duration, the second negative bias voltage being less than the first negative bias voltage.

3. The method of claim 1, wherein the method of plasma processing is an atomic layer etching (ALE) process.

4. The method of claim 1, wherein the method of plasma processing is a self-aligned contact (SAC) etching process.

5. The method of claim 1, wherein the second surface of the substrate is an exposed surface of a fill material disposed in a recessed region comprising a high aspect ratio.

6. The method of claim 5, wherein the high aspect ratio is greater than about 50 and less than or equal to about 100.

7. The method of claim 1, further comprising:

forming a second polymer layer at a third surface of the substrate using a second electron beam directed toward the third surface, the second electron beam being generated for a third duration by a third negative bias voltage at the first surface, wherein the third surface is an etched surface formed by the etching of the first polymer layer and the second surface; and after the third duration, etching the second polymer layer and the third surface of the substrate by accelerating positive ions of the inductively coupled plasma towards the third surface using a fourth negative bias voltage applied for a fourth duration.

8. The method of claim 1, further comprising: applying the second negative bias voltage to the substrate holder for the first duration.

9. The method of claim 8, wherein the second negative bias voltage is at a first value during the first duration and the second negative bias voltage is at a second value different from the first value during the second duration.

10. The method of claim 1, wherein applying the second negative bias voltage comprises continuously applying the second negative bias voltage to the substrate holder for the continuous duration.

11. The method of claim 1, wherein the first duration is less than about 3 ms.

12. A method of plasma processing, comprising:

continuously providing a single gas into a processing chamber for a continuous duration without gas switching;

continuously providing alternating current (AC) source power to a source power coupling element during the continuous duration, the AC source power generating an inductively coupled plasma in the processing chamber;

during the continuous duration, applying a first negative bias voltage at a first surface of an electron source electrode facing a second surface of a substrate disposed in the processing chamber, the first negative bias voltage generating a first electron beam directed toward the second surface for a first duration, wherein the first negative bias voltage is a substantially constant DC voltage;

removing the first negative bias voltage from the electron source electrode at the end of the first duration to discontinue the generation of the first electron beam for a second duration;

after the first duration and during the continuous duration, applying a second negative bias voltage during the second duration to a substrate holder supporting the substrate, the second negative bias voltage being a radio frequency signal comprising a negative DC offset applied to the substrate holder supporting the substrate; and applying the second negative bias voltage during the first duration, the second negative bias voltage being less than the first negative bias voltage.

13. The method of claim 12, wherein the method of plasma processing is an atomic layer etching (ALE) process.

14. The method of claim 12, wherein the method of plasma processing is a self-aligned contact (SAC) etching process.

15. The method of claim 12, wherein the second surface of the substrate is an exposed surface of a fill material disposed in a recessed region comprising a high aspect ratio.

16. The method of claim 12, wherein the first electron beam generated while applying the first negative bias voltage forms a first polymer layer at the second surface of the substrate, and wherein applying the second negative bias voltage to the substrate holder etches the first polymer layer and the second surface by accelerating positive ions of the inductively coupled plasma towards the second surface.

17. A method of plasma processing, comprising:

continuously providing a single gas into a processing chamber for a continuous duration without gas switching;

during the continuous duration, generating an inductively coupled plasma in the processing chamber; and during the continuous duration, cyclically performing the following steps:

forming a polymer layer at a first surface of a substrate disposed in the processing chamber using an electron beam directed toward the first surface, the electron beam being generated for a first duration by a first negative bias voltage at a second surface of an electron source electrode facing the first surface, wherein the first negative bias voltage is a substantially constant DC voltage; and after the first duration, etching the polymer layer and the first surface of the substrate by accelerating positive ions of the inductively coupled plasma towards the first surface using a second negative bias voltage applied for a second duration, the second negative bias voltage being a radio frequency signal comprising a negative DC offset applied to a substrate holder supporting the substrate.

18. The method of claim 17, wherein the first surface of the substrate is an exposed surface of a fill material disposed in a recessed region comprising a high aspect ratio.

19. The method of claim 18, wherein the high aspect ratio is greater than about 50 and less than or equal to about 100.

* * * * *